(12) United States Patent
Trias

(10) Patent No.: US 10,615,638 B1
(45) Date of Patent: Apr. 7, 2020

(54) SYSTEM AND METHOD FOR OBSERVING CONTROL LIMITS IN POWERFLOW STUDIES

(71) Applicant: Antonio Trias, Sant Cugat del Valles (ES)

(72) Inventor: Antonio Trias, Sant Cugat del Valles (ES)

( * ) Notice: Subject to any disclaimer, the term of this patent is extended or adjusted under 35 U.S.C. 154(b) by 0 days.

(21) Appl. No.: 15/173,708

(22) Filed: Jun. 5, 2016

Related U.S. Application Data

(60) Provisional application No. 62/289,370, filed on Feb. 1, 2016, provisional application No. 62/187,839, filed on Jul. 2, 2015.

(51) Int. Cl.
| | |
|---|---|
| *G05D 3/12* | (2006.01) |
| *H02J 3/00* | (2006.01) |
| *G06N 5/00* | (2006.01) |
| *G06F 1/26* | (2006.01) |
| *H02J 13/00* | (2006.01) |
| *G01R 21/133* | (2006.01) |

(52) U.S. Cl.
CPC ........ *H02J 13/0006* (2013.01); *G01R 21/133* (2013.01); *H02J 3/00* (2013.01); *H02J 2003/007* (2013.01)

(58) Field of Classification Search
CPC .... H02J 13/0006; H02J 3/00; H02J 2003/007; G01R 21/133
See application file for complete search history.

(56) References Cited

U.S. PATENT DOCUMENTS

| | | | | |
|---|---|---|---|---|
| 7,519,506 B2 * | 4/2009 | Trias | ........................ | H02J 3/00 700/286 |
| 7,660,649 B1 * | 2/2010 | Hope | ..................... | G06Q 10/04 700/28 |

(Continued)

OTHER PUBLICATIONS

Optimal_Power, Optimal Power Flow Problem & Solution, 2012, p. 38-150.*

(Continued)

*Primary Examiner* — Mohammad K Islam

(57) ABSTRACT

A system and method is presented for observing and efficiently enforcing control limits in powerflow studies of electrical power systems, using a novel optimality criterion. The method applies to any automatic control in which the controlling resource is limited by a maximum or minimum value, such as MVArs in generators, the tap ratio in load-changing transformers, or real power output in AGC-participating generators. In the absence of information about relative priorities among automatic controls, or about their dynamic behavior (as it is the common case in steady-state powerflow studies), the new optimality criterion provides the most reasonable method for deciding among multiple possible alternatives of saturated controls. The criterion is based on underlying physical principles that yield exact results in the idealized lossless transmission network, and hold also true to a great degree in real high-voltage transmission networks. The method can be applied to retrofit any existing powerflow method, but in its preferred embodiment it uses the Holomorphic Embedding Load-flow Method (HELM) because of its reliability and deterministic properties.

12 Claims, 3 Drawing Sheets

(56) References Cited

U.S. PATENT DOCUMENTS

| | | | | |
|---|---|---|---|---|
| 9,184,589 B2* | 11/2015 | Raghunathan | ............ | H02J 3/00 |
| 9,229,437 B2* | 1/2016 | Kalagnanam | .......... | G06Q 50/06 |
| 9,863,985 B2* | 1/2018 | Giannakis | ............ | G01R 21/133 |
| 10,326,280 B1* | 6/2019 | Sarwat | .................... | H02J 3/383 |
| 2004/0246643 A1* | 12/2004 | Chen | ......................... | H02J 3/00 |
| | | | | 361/115 |
| 2004/0249775 A1* | 12/2004 | Chen | ..................... | G06Q 50/06 |
| | | | | 706/21 |
| 2004/0260489 A1* | 12/2004 | Mansingh | .............. | G06Q 50/06 |
| | | | | 702/60 |
| 2004/0264083 A1* | 12/2004 | Mansingh | ................. | H02J 3/00 |
| | | | | 361/62 |
| 2012/0150504 A1* | 6/2012 | Akrotirianakis | ......... | G06F 17/11 |
| | | | | 703/2 |
| 2013/0238148 A1* | 9/2013 | Legbedji | ................. | G06Q 10/04 |
| | | | | 700/286 |
| 2013/0257372 A1* | 10/2013 | Chen | ....................... | B60L 53/68 |
| | | | | 320/109 |
| 2013/0297089 A1* | 11/2013 | Fu | ............................ | G06F 1/26 |
| | | | | 700/295 |
| 2013/0304266 A1* | 11/2013 | Giannakis | ............ | G01R 21/133 |
| | | | | 700/286 |
| 2014/0052301 A1* | 2/2014 | Raghunathan | ............ | H02J 3/00 |
| | | | | 700/286 |
| 2014/0244059 A1* | 8/2014 | Raghunathan | ............ | H02J 3/00 |
| | | | | 700/295 |
| 2014/0266041 A1* | 9/2014 | Ghosh | ................. | B60L 11/1846 |
| | | | | 320/109 |
| 2014/0371940 A1* | 12/2014 | Ilic | ............................ | H02J 3/38 |
| | | | | 700/297 |
| 2015/0094965 A1* | 4/2015 | Schneider | ............ | G01R 21/133 |
| | | | | 702/58 |
| 2015/0168465 A1* | 6/2015 | Gadiraju | ............ | H02J 13/0006 |
| | | | | 702/60 |
| 2015/0199606 A1* | 7/2015 | Raghunathan | ............ | G06N 5/04 |
| | | | | 706/53 |
| 2015/0377936 A1* | 12/2015 | Ghosh | .................. | G01R 21/133 |
| | | | | 702/60 |
| 2015/0378384 A1* | 12/2015 | Phan | ......................... | H02J 3/00 |
| | | | | 700/287 |
| 2016/0077507 A1* | 3/2016 | Sheble | .................... | G06Q 10/06 |
| | | | | 700/295 |
| 2016/0259314 A1* | 9/2016 | Dhople | ................. | G05B 19/102 |
| 2018/0152020 A1* | 5/2018 | Kuroda | ..................... | H02J 3/00 |

OTHER PUBLICATIONS

Yoshihiko et al., A Smooth Power Flow Model of Electric Power System with Generator Reactive Power Limits Taken into Consideration, 2005, p. 5286-5289.*

Trias, The Holomorphic Embedding Load Flow Method (Year: 2012).*

Mohammadi et al. ,Distributed Approach for DC Optimal Power Flow (Year: 2014).*

Tinoco et al., Alternative methods for solving power flow problems, (Year: 2012).*

Subramanian et al. ,PV Bus Modeling in a Holomorphically Embedded Power-Flow Formulation (Year: 2013).*

\* cited by examiner

SYSTEM AND METHOD FOR OBSERVING CONTROL LIMITS IN POWERFLOW STUDIES

CROSS REFERENCE TO RELATED APPLICATIONS

The present application claims the benefit of U.S. Patent Application Ser. No. 62/187,839 entitled "SYSTEM AND METHOD FOR OBTAINING THE POWERFLOW IN DC GRIDS WITH CONSTANT POWER LOADS AND DEVICES WITH ALGEBRAIC NONLINEARITIES", filed on Jul. 2, 2015, and U.S. Patent Application Ser. No. 62/289,370 entitled "SYSTEM AND METHOD FOR OBSERVING CONTROL LIMITS IN POWERFLOW STUDIES", filed Feb. 1, 2016, the entire teachings of which are incorporated herein by reference.

BACKGROUND

Systems and methods herein generally relate to the problem of calculating powerflow studies of electrical networks, and more particularly to methods for incorporating and enforcing the physical limits of system controls in those studies.

Powerflow studies need to incorporate the effects of several kinds of automatic regulating devices that are always present in the operation of electrical networks. A non-exhaustive list of the most interesting ones, from the point of view of steady-state powerflows, comprises: voltage regulation by generators (AVR, Automatic Voltage Regulation) or by transformers (ULTC, Under-Load Tap Changers), frequency regulation by generators participating in AGC (Automatic Generation Control), real power regulation by phase shifters, reactive power regulation by transformers, and net real power regulation across tie lines (area interchange schedules). Additionally, controls may be local or remote. Some remote controls may be real, enabled by modern fast telecommunications; others are just convenient artifacts used in the context of planning studies (e.g. area interchange schedules). Whatever the case, a power flow method needs to incorporate all these types of control in order to be useful for real work. One crucial aspect, which is the subject of the present invention, is the correct enforcement of control limits. For instance, automatic voltage regulation in a generator is limited by the minimum and maximum values of reactive power output; when those limits are reached, the control resource "saturates" and can no longer sustain the desired voltage setpoint.

Traditional iterative powerflows deal with controls using either one of these two general approaches: (a) incorporating additional equations and new control variables into the definition of the matrix of the method (possibly eliminating some variables if they are given directly by the control setpoints); (b) keeping the original equations and using an "outer loop" approach, whereby the control variables are adjusted in between iterations, in proportion to the residuals of the regulated magnitude. The proportionality coefficients for these adjustments, the so-called sensitivities, are obtained either by theoretical modeling, direct computation, or empirical tests. This option (b) is favored by methods that keep the Jacobian constant through the iterations, such as the FDLF (Fast Decoupled Load Flow) method of Stott and Alsac, because it allows taking into account control limits in a fast manner. This, however, makes convergence behavior even harder to model and analyze. By contrast, the treatment of limits in method (a) requires a change in the equations in between iterations (for instance, a PV to PQ bus-type switch), so it would be more suited for a full NR (Newton Raphson) method.

Enforcing control limits raises several challenges in powerflow studies. The main one is that it makes the solution harder to arrive at. Iterative methods generally will take more iterations to converge, and moreover, subtle interactions between controls (due to the nonlinear nature of the problem) may conspire to produce "oscillations", in which one or more controls have to bounce off their limits from one iteration to the next, therefore preventing convergence. Over the years, many heuristic techniques have been devised to improve the convergence rate of the industry-standard Newton-Raphson and Fast Decoupled powerflows in the presence of limits, with varying degrees of success. To date, it is a fair assessment to say that this problem has not been solved, as it keeps appearing in the everyday work of powerflow practitioners.

Additionally, most efforts have been devoted only to improving the chances of convergence, accelerating the convergence rate, and avoiding oscillations between saturated and non-saturated states. In contrast, very little has been done to address the problem of choosing among different configurations of saturated and non-saturated control states. In other words, due to nonlinearities, the problem may have multiple non-equivalent solutions, and therefore some sort of criterion is needed in order to select one. The trouble with both iterative approaches (a) and (b) mentioned above is that this issue is not even contemplated: the decisions as to which controls should reach saturation and which should not, are just the result of the unpredictable "dynamics" of the numerical iteration. The end result is that the inherent problems of fractality in iterative methods (which may cause divergence, or landing on a low-voltage solution) are then compounded by this somewhat arbitrary choice of saturated controls, dictated purely by the numerics.

Note that in cases in which there exists any additional information to help decide the relative priorities for saturation, such information may be trivially incorporated by powerflow methods. For instance, information about the timing response of controls; or about the operational details of their mutual coordination. But the invention disclosed here is concerned with the general scenario in steady-state powerflow studies, where none of this information is available and therefore this selection problem arises.

In contrast with iterative powerflow methods, U.S. Pat. Nos. 7,519,506 and 7,979,239 to Trias, take a very different approach to controls. The method, from here onwards termed the Holomorphic Embedding Load-flow Method (HELM), is non-iterative, constructive, and takes advantage of the specific mathematical structure of the power flow problem by using the techniques of Complex Analysis. Whereas iterative powerflows combine controls and their associated limits under the same treatment, HELM deals with automatic controls using a two-layered approach. The first layer incorporates control equations considering unlimited controlling resources, therefore using equality constraints for the setpoints. The smooth properties of these equality constraints allow them to be holomorphically embedded, thus preserving all the nice deterministic properties of the HELM core method. The second layer, which is the subject of the present invention, takes care of control limits by adding the inequality constraints for the control resources. This second problem is solved as an optimization problem, defining a suitable functional that is rooted in the physical insights gained by the underlying HELM method. As such, this optimization method is out of the core HELM methodology and therefore it may be applied to other powerflow methods in order to deal with control limits.

Seemingly related methods come from the area known as "Optimal Power Flow" (OPF). However, the problem of OPF is quite different from the standard steady-state powerflow one. Many of the magnitudes that are given as fixed parameters in a powerflow study become free variables in OPF, subject to global optimization under some prescribed functional and constraints. By contrast, a powerflow study had always been seen as a problem in solving a system of equations for the solution, implicitly assuming that there could only be one. The first innovative aspect of the invention herein disclosed is realizing the fact that the powerflow problem with control limits is really a problem in optimization. The second innovative aspect is the construction of the actual criterion to be used for the optimization.

SUMMARY

The method disclosed herein comprises a procedure for contemplating and correctly enforcing the effect of limits of control devices (also known as regulating devices) in the steady-state solution of electrical power networks. The present disclosure is framed under the general field of powerflow studies (also known as load-flow studies) of power systems. It is mainly inspired by the Holomorphic Embedding Loadflow Method (HELM), first described in U.S. Pat. Nos. 7,519,506 and 7,979,239. The method disclosed herein contemplates any general type of control device for which the controlling resource (such as injected MVArs, MW, a tap ratio, or any other physical resource) has physical hard limits that must be observed and enforced in the powerflow solution. This method may be applied to any powerflow method, but its most efficient embodiment known to date uses HELM as the underlying powerflow, due to its reliable deterministic properties.

The enforcement of control limits raises two different kinds of challenges in powerflow studies. The first one is that it makes the solution harder to arrive at: iterative methods converge at a slower rate, and moreover control saturations may exhibit oscillatory behavior between iterations. The second kind of challenge is seldom recognized, but quite fundamental: for feasible powerflows, there may be more than one acceptable solution, the only difference among them being the particular choice of control devices saturated at their physical limits.

The innovation disclosed here addresses the two aforementioned problems. It is based on the key insight that a powerflow problem with control limits becomes a problem in optimization. Note however that this is quite different from the general problem of Optimal Power Flow (OPF).

The systems and methods disclosed herein solve the problem of control limits by first constructing a Lagrangian function. This is the Lagrangian from which the powerflow equations are derived by the usual technique of finding its local minima. This construction is only possible in the limit of an ideal, lossless transmission network, where all branches (i.e. lines and transformers) have zero transmission resistance. In real networks with losses, it is postulated that the minimization criterion provided by this Lagrangian is still valid, by virtue of the relatively small resistances of transmission lines and transformers.

The problem is then solved as a minimization where the Lagrangian provides the functional to be minimized, just like the well-known standard procedure in the area of classical mechanics in physics. This is justified on the grounds of the physical properties of the power system, which are embodied by this Lagrangian. It is thus found that the criterion amounts to the minimization of the overall reactive power losses in the system. This is therefore the postulated criterion to decide the best solution among possibly several alternative configurations of saturated controls.

The minimization is then solved through techniques of exploratory search in the state-space of powerflow solutions, by means of the well-known A* algorithm. Such state-space is to be understood as a space where states are solutions to the unbounded-controls powerflow problem, and the search consists in choosing various combinations of control saturations, discarding unfeasible solutions along the way. Feasibility in this context requires not only that the underlying powerflow must be feasible, but also that: (1) no controls are violating their resource limits; (2) no unsaturated controls still have a remaining margin to correct violations of their setpoint/control band; and (3) no controls have been saturated unnecessarily. To speed up the search, several heuristics based on the mathematical apparatus of HELM theory are used. The final solution is selected as the one minimizing the Lagrangian among the feasible solutions that have been found along the search.

The exemplary embodiment herein disclosed utilizes HELM as the underlying powerflow solver method and the A*-search algorithm as the optimization solving method, since this combination has been shown to have good performance in practice. However, the method can in principle be implemented using other powerflow solvers as well, and the particular technique used for solving the optimization problem may also be a different one, given the extensive literature on optimization. The innovation is inspired in the effective linearizing properties of the HELM method, whereby the original nonlinear problem is turned into an infinite sequence of chained linear systems. Exploitation of this key insight, together with the realization that smooth and unbounded controls result in additional holomorphic functions and constraint equations, yields a method in which some powerful tools of linear algebra can be put to good use. In particular, the method automatically defends against possible conflicts or overlaps among different controls, which would otherwise result in an over-determined or under-determined system (it achieves this through a technique based on the Singular Value Decomposition, SVD). This is a very common problem in large network models of transmission system operators, so in this sense the method provides an additional aspect of robustness on top of the reliability already provided by the base HELM method. It may potentially save the analyst a tremendous amount of the time cleaning the model from conflicting controls.

The systems and methods disclosed herein encompass the most general types of control devices. In such abstract formulation, there are many opportunities for simplification and performance optimization if one applies specialized treatment to the specific types of control devices that allow such thing. It is expected that any person skilled in the art will be able to arrive at many useful particularizations of the general method disclosed here.

DETAILED DESCRIPTION

Consider the power flow equations that describe the steady-state of a basic power system comprised of constant PQ power injections plus (optionally) constant current injection terms:

$$\sum_{j \neq i} Y_{ij}^{(tr)}(V_i - V_j) + V_i Y_i^{(sh)} = I_i + \frac{S_i^*}{V_i^*} \quad (1)$$

Figure 1:
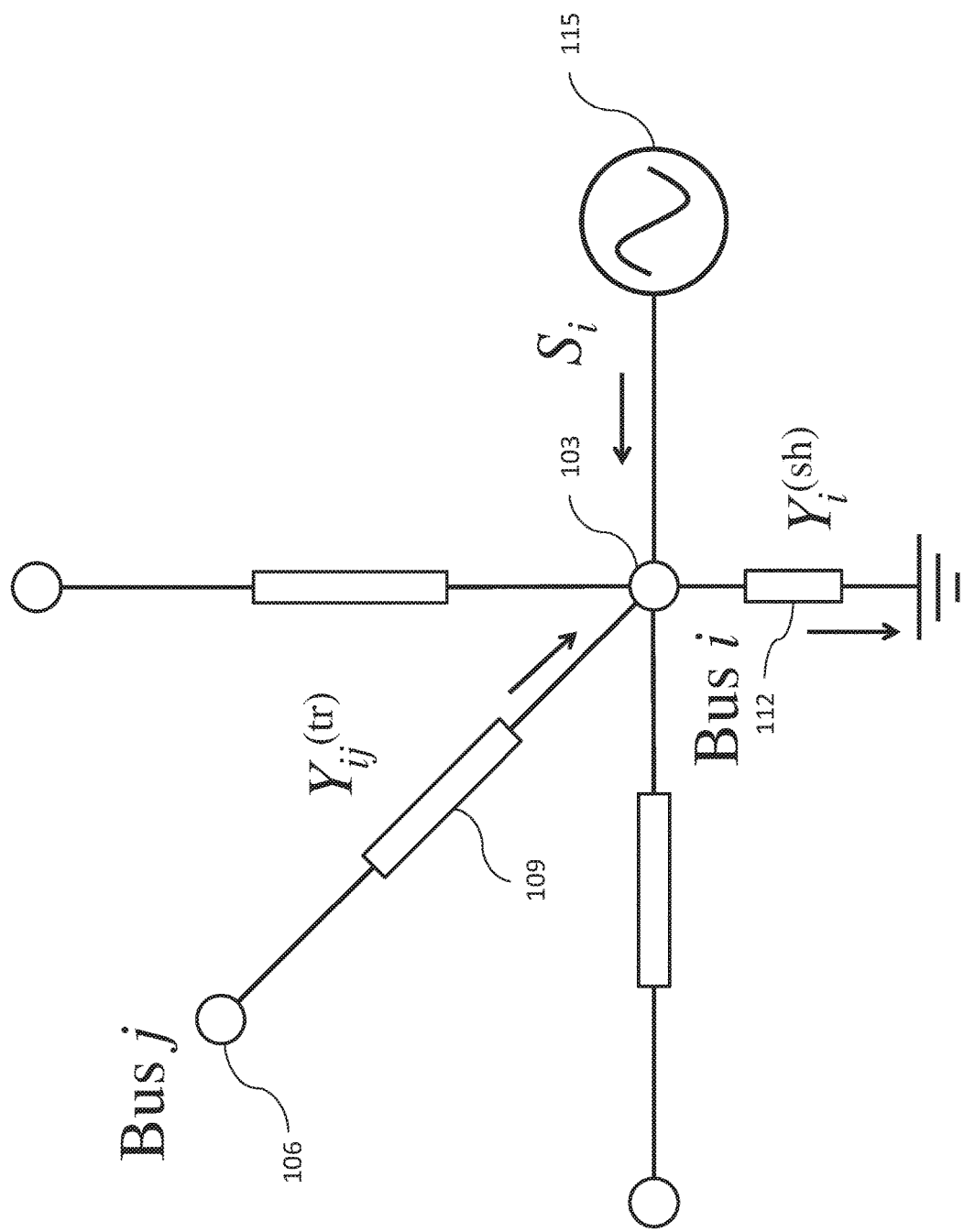
FIG. 1 is a schematic representation of a power network, displaying the sign conventions for voltage and power flow magnitudes as they are used in the description of the systems and methods herein.

The nomenclature and sign conventions used in the description of the systems and methods disclosed herein are depicted in FIG. 1. This schematic drawing illustrates a generic electric power network. Equation (1) holds for the voltage $V_i$ at each bus i 103, and the summation on the right hand side runs over all neighbor buses j 106, which are linked by transmission lines 109 having admittances $Y_{ij}^{(tr)}$ 109. The shunt term $Y_i^{(sh)}$ 112 is meant to include both the line susceptance and any other constant-impedance modeling component of the load or any other device attached to the bus. Each bus i 103 may also have constant current $I_i$ or constant power injections $S_i$ provided by a load or generator 115. The load-flow equations (1) therefore represent the balance of currents at the bus: the terms on the right hand side are the net current entering the node, while the terms on the left hand side are the net current leaving the node.

From the point of view of steady-state powerflows, controls are additional mathematical constraints on the variables. These constraints consist in either control setpoints or control ranges for some variables of the system, typically voltages or power flows. In turn, each constraint necessarily introduces a corresponding controlling variable, also known as the controlling resource, in order to keep the number of equations and the number of degrees of freedom (i.e. the actual number of free variables) balanced. For instance, the simplest example of control is the automatic regulation of voltage at so-called PV buses, where the controlling resource is the reactive injection Q provided by the attached generator. Other examples of control resources are the tap ratio a in a regulating transformer (so-called ULTC transformers); or the weighed sum of real power outputs of designated generators, in the case of an area interchange schedule.

Adding automatic controls to the powerflow problem would still result in smooth algebraic equations, if it were not for the existence of hard limits: control resources are always limited. For instance, generators VARs (Q injection) have hard lower and upper limits; ULTC transformer taps have physical minimum and maximum settings. These add new inequality constraints to the equations, and this is what causes the sort of problems mentioned in the Background section. The method disclosed herein addresses those problems by first realizing that the inequality constraints produce potentially multiple valid solutions. Therefore the first problem lies in establishing a suitable criterion to decide which solution should be selected. The method proposes the minimization of a suitable constructed Lagrangian function as the criterion, supported by arguments based on the fundamental physics of the powerflow problem. Once this Lagrangian is constructed, the problem is akin to a combinatorial optimization, where the goal is to find the combination of saturated and non-saturated controls that minimize this Lagrangian (while still yielding a feasible powerflow solution).

The first step of the method is therefore to construct a suitable objective function for the minimization procedure. Consider the limit of the ideal transmission network, in which all resistances are set to zero. Then the conductances G of all lines and transformers vanish, and all admittances (Y=G+jB) in the network, including shunt admittances, become pure imaginary. Let us write then the powerflow equations for this ideal network, in their real and imaginary components:

$$-\sum_{j \neq i} B_{ij}^{(tr)} \text{Im}(V_i - V_j) - B_i^{(sh)} \text{Im } V_i = \text{Re } I_i + \frac{(P_i \text{Re} V_i + Q_i \text{Im} V_i)}{\|V_i\|^2} \quad (2)$$

$$\sum_{j \neq i} B_{ij}^{(tr)} \text{Re}(V_i - V_j) + B_i^{(sh)} \text{Re } V_i = \text{Im } I_i + \frac{(P_i \text{Im} V_i - Q_i \text{Re} V_i)}{\|V_i\|^2}$$

Written in this form, it is straightforward to verify that these equations can be derived from the minimization of the following Lagrangian function:

$$L = -\frac{1}{2} \sum_{i<j} B_{ij}^{(tr)} \{ (\text{Re } V_i - \text{Re } V_j)^2 + (\text{Im } V_i - \text{Im } V_j)^2 \} \quad (3)$$

$$-\frac{1}{2} \sum_i B_i^{(sh)} \{ (\text{Re } V_i)^2 + (\text{Im } V_i)^2 \}$$

$$-\sum_i (\text{Re } I_i \text{Im } V_i - \text{Im } I_i \text{Re } V_i)$$

$$-\frac{1}{2} \sum_i Q_i \ln\{ (\text{Re } V_i)^2 + (\text{Im } V_i)^2 \} - \sum_i P_i \tan^{-1}\left(\frac{\text{Im} V_i}{\text{Re} V_i}\right)$$

If the complex voltages V=(Re V+j Im V) and currents I=(Re I+j Im I) are now reinterpreted to be vectors in 2-dimensional real space, equation (3) can be written in a much more compact form:

$$L = -\frac{1}{2} \sum_{i<j} B_{ij}^{(tr)} \|V_i - V_j\|^2 - \frac{1}{2} \sum_i B_i^{(sh)} \|V_i\|^2 \quad (4)$$

$$-\sum_i \|I_i \times V_i\| - \frac{1}{2} \sum_i Q_i \ln \|V_i\|^2 - \sum_i P_i \theta_i$$

Let us analyze the meaning of each term in this Lagrangian expression. The first term happens to be the sum of the reactive power losses over all the transmission branches of the network (divided by two). Since the susceptance $B_{ij}$ of transmission lines is always negative, this first term is always positive. The next term is similar in nature, as it accounts for the reactive power injection/consumption due to shunt admittance terms. These originate mainly from in line charging susceptances, but may also include contributions from constant-impedance load models.

The next term, containing the cross product of vectors $I_i$ and $V_i$ at each bus, shows the effect of prescribed, local constant-current injections (its interpretation may not be obvious, but note that its dimensions are also those of power). The next term may be interpreted as a sort of "external field" potential energy provided by an external "charge" $Q_i$, exerting a local logarithmic potential on each node. The last term may also be interpreted as produced by an additional external field, this time mediated by external charges $P_i$ on each node, and exerting a sort of transversal force that tries to rotate the voltage vector. As we can see all terms in this Lagrangian consist of magnitudes having power dimensions, and can be interpreted in terms of a certain potential energy. When this energy is minimized, the original powerflow equations are recovered.

The method now uses the Lagrangian defined by equation (4) as the criterion to select different solutions, when in the context of a combinatorial search for the best arrangement of saturated and non-saturated states solving the powerflow problem. The high-level overview of the optimization program is as follows: using a powerflow solver in which control variables are smooth and unbounded, search for states that are powerflow solutions and at the same time satisfy these three conditions: (a) the state should contain no violations of the controlling resources (that is, no VAr or tap limit violations); (b) for those controls that are not saturated, the state should have no violations of their control setpoint or band (the powerflow solver is supposed to avoid this for smooth controls, but it may still happen with discrete stepping controls); and (c) for those controls that are saturated, there should be no "bounces" (i.e. states where the local sensitivity of the control indicates that the corresponding setpoint/band can be achieved by un-saturating the control). Among all states found satisfying these three conditions, pick the one having the lowest value of the Lagrangian expression given by equation (4). Although this selection criterion is only exact in the limit of an ideal lossless network, in practice it is found that it still provides satisfactory results because transmission networks (for which the R/X ratio is very small) are actually quite close to this ideal limit.

One preferred embodiment for this optimization search consists in using the HELM method as the underlying powerflow solver, together with the A* algorithm as the framework for the search. The A* algorithm, very well known in the Artificial Intelligence domain, performs a search guided by heuristics. The heuristics are designed here to accomplish a double goal: guide the search towards solutions having a lower value of the Lagrangian, and try to avoid unfeasible ones, thus speeding up the search. One of the main reasons for using the HELM powerflow is that its deterministic properties allow the A* algorithm to reliably explore any chosen combination of saturated and non-saturated controls without having to worry about convergence problems in the powerflow calculation: the outcome is always either feasible or unfeasible, with no possible ambiguity. The other reason is that the internal mathematical structures computed by HELM are a source of additional heuristics for the A* search: HELM Sigma indicators are useful for avoiding unfeasible states, for instance.

To conclude, we should mention that the optimization procedure might be accomplished by many other numerical methods besides the one exposed here. The relevant inventive aspect of the disclosed method is that the powerflow solution should minimize the Lagrangian expression in equation (4).

Figure 2:
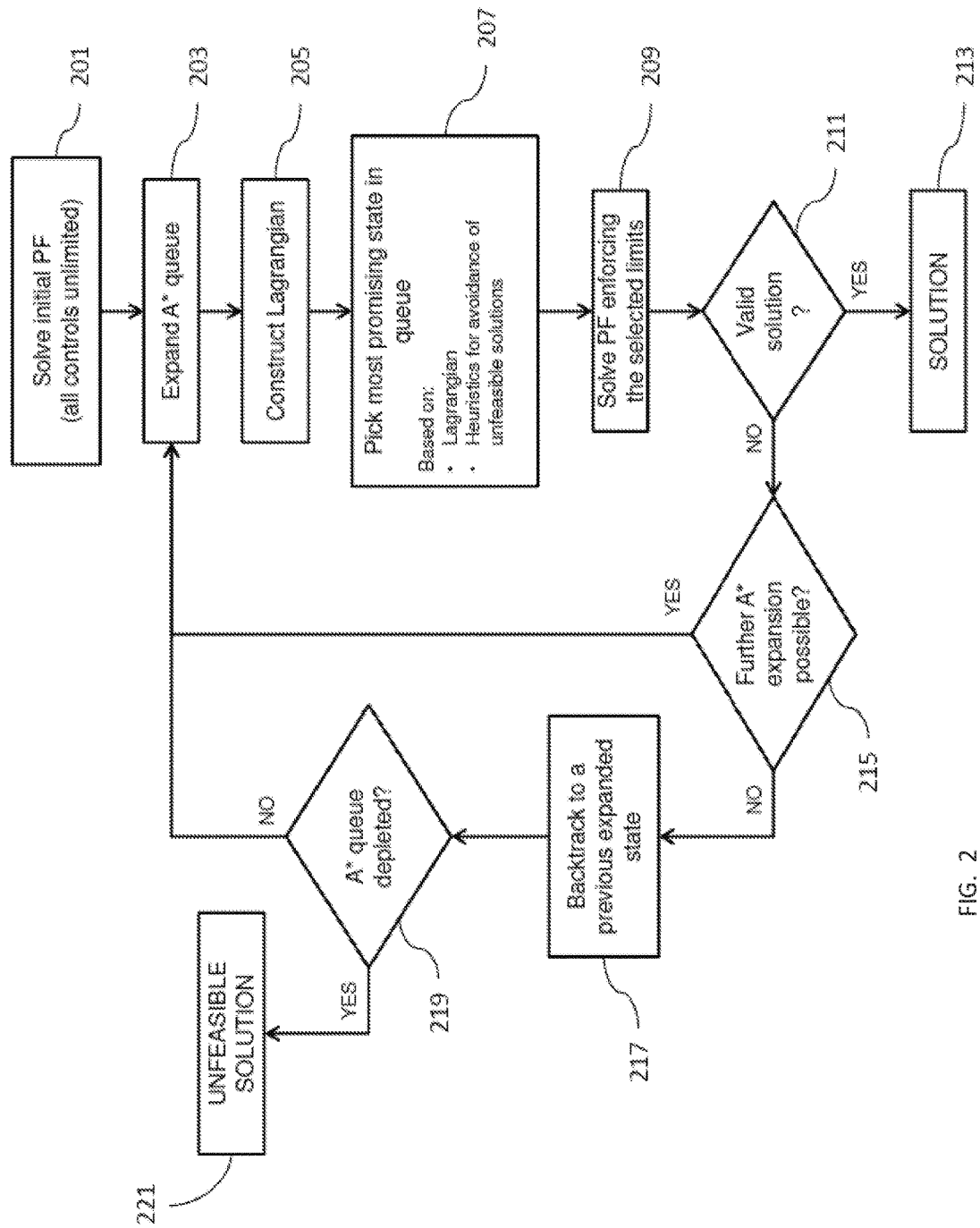
FIG. 2 is a flow diagram illustrating systems and methods herein.

A flow chart summarizing the steps of the procedure disclosed herein is depicted in FIG. 2. The overall structure follows the well-known A* algorithm as a framework. The method begins by solving the powerflow problem (step 201), using an underlying powerflow solver in which automatic controls with smooth control variables are enabled, but their resource limits are considered unlimited. The next step 203 consists in the expansion of possible states to search. Each state consists in a particular choice of saturated and non-saturated controls, for the set of controls that were violating resource limits in the previous step. The following step 205 consists in constructing the Lagrangian given by equation (4), and computing its value on the candidate states that have been expanded in the step before. The next step 207 consists in applying the values of the Lagrangian and suitable additional heuristics for avoiding unfeasible solutions, in order to select the most promising state in the current A* queue. Step 209 then consists in solving the constrained powerflow problem, in which the particular saturated controls of the selected state are locked on their limits by the usual technique (e.g. PV to PQ type switching in the case of a bus; tap-locking on the maximum or minimum position for an ULTC transformer, and so on). Step 211 consists in checking whether the solution coming out of the powerflow solver satisfies all the requirements mentioned above, that is, absence of control resource violations, control setpoint/band violations (for unsaturated ones), or control bounces. If this is the case, the solution has been found (step 213). If the solution is not valid, the next step 215 is to check whether it is possible to keep expanding further states from the current state. If this is the case, the method continues from step 203 onwards again. If not, then the method backtracks to a previously expanded state in the A* queue (step 217). If there are still more states to explore in the queue (step 219), then the method continues by expanding from the next one in the queue, going back to step 203. If not, then the exploration stops and the result is that there exists no feasible solution to the problem.

Figure 3:
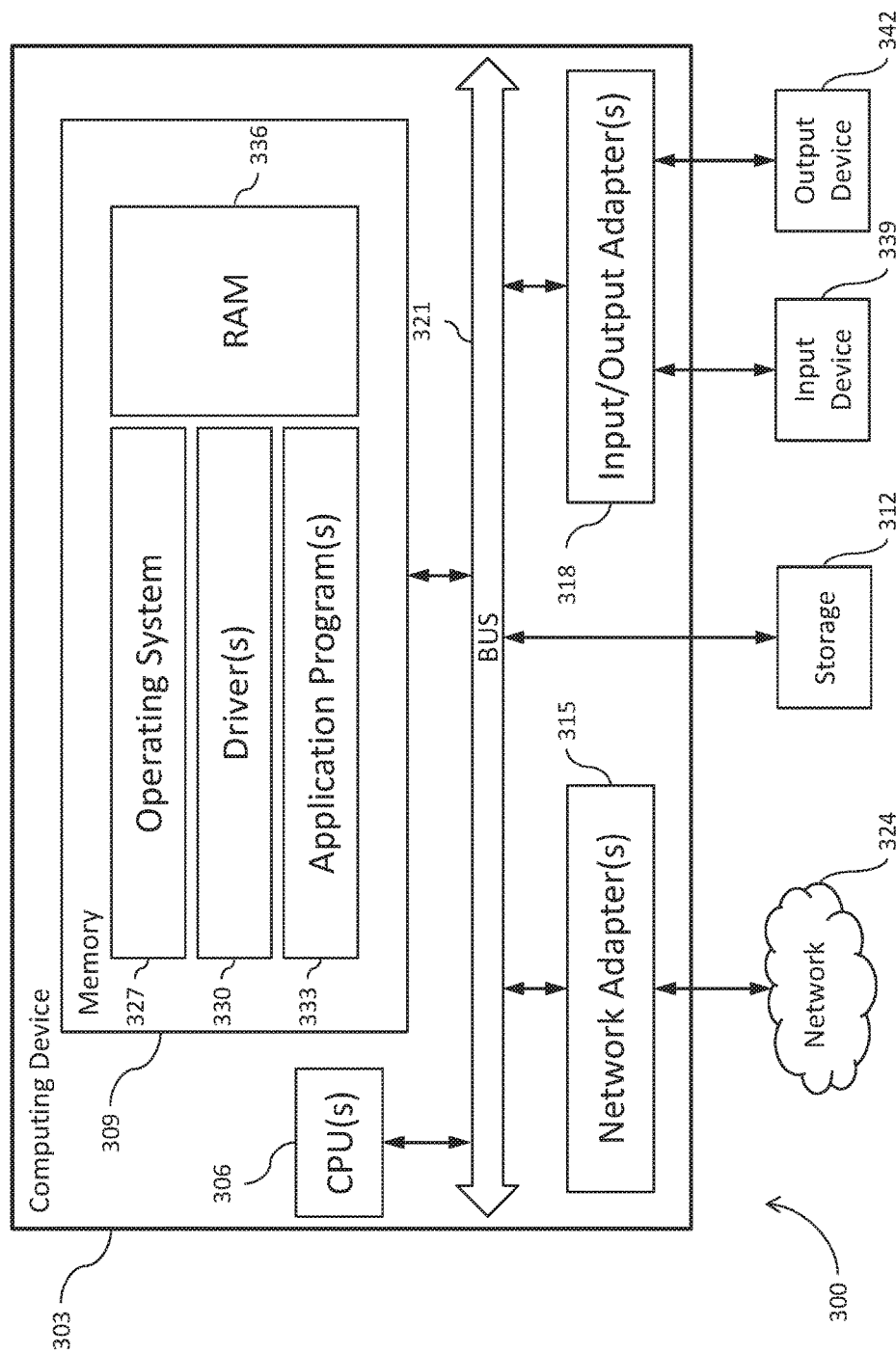
FIG. 3 is a schematic diagram of a hardware system according to systems and methods herein.

A representative hardware environment for practicing the systems and methods described herein is depicted in FIG. 3. This schematic drawing illustrates a hardware configuration of an information handling/computing system 300 in accordance with systems and methods herein. The computing system 300 comprises a computing device 303 having at least one processor or central processing unit (CPU) 306, internal memory 309, storage 312, one or more network adapters 315, and one or more input/output adapters 318. A system bus 321 connects the CPU 306 to various devices such as the internal memory 309, which may comprise random access memory (RAM) and/or read-only memory (ROM), the storage 312, which may comprise magnetic disk drives, optical disk drives, a tape drive, etc., the one or more network adapters 315, and the one or more input/output adapters 318. Various structures and/or buffers (not shown) may reside in the internal memory 309 or may be located in a storage unit separate from the internal memory 309.

The one or more network adapters 315 may include a network interface card such as a LAN card, a modem, or the like to connect the system bus 321 to a network 324, such as the Internet. The network 324 may comprise a data processing network. The one or more network adapters 315 perform communication processing via the network 324.

The internal memory 309 stores an appropriate Operating System 327, and may include one or more drivers 330 (e.g., storage drivers or network drivers). The internal memory 309 may also store one or more application programs 333 and include a section of Random Access Memory (RAM) 336. The Operating System 327 controls transmitting and retrieving packets from remote computing devices (e.g., host computers, storage systems, SCADA, etc.) over the network 324. In some systems and methods, the Supervisory and Data Acquisition Systems and/or Energy Management Systems may connect to the computing system 300 over the network 324. The drivers 330 execute in the internal memory 309 and may include specific commands for the network adapter 315 to communicate over the network 324. Each network adapter 315 or driver 330 may implement logic to process packets, such as a transport protocol layer to process the content of messages included in the packets that are wrapped in a transport layer, such as Transmission Control Protocol (TCP) and/or Internet Protocol (IP).

The storage 312 may comprise an internal storage device or an attached or network accessible storage. Storage 312 may include disk units and tape drives, or other program storage devices that are readable by the system. A removable medium, such as a magnetic disk, an optical disk, a magneto-optical disk, a semiconductor memory, or the like, may be installed on the storage 312, as necessary, so that a computer program read therefrom may be installed into the internal memory 309, as necessary. Programs in the storage 312 may be loaded into the internal memory 309 and executed by the CPU 306. The Operating System 327 can read the instructions on the program storage devices and follow these instructions to execute the methodology herein.

The input/output adapter 318 can connect to peripheral devices, such as input device 739 to provide user input to the CPU 306. The input device 339 may include a keyboard, mouse, pen-stylus, microphone, touch sensitive display screen, or any other suitable user interface mechanism to gather user input. An output device 342 can also be connected to the input/output adapter 318, and is capable of rendering information transferred from the CPU 306, or other component. The output device 342 may include a display monitor (such as a Cathode Ray Tube (CRT), a Liquid Crystal Display (LCD), or the like), printer, speaker, etc.

The computing system 700 may comprise any suitable computing device 303, such as a mainframe, server, personal computer, workstation, laptop, handheld computer, telephony device, network appliance, virtualization device, storage controller, etc. Any suitable CPU 306 and Operating System 327 may be used. Application Programs 333 and data in the internal memory 309 may be swapped into storage 312 as part of memory management operations.

It is expected that any person skilled in the art can implement the disclosed procedure using a computer program. The computer program may include instructions that would be provided to a processor of a general purpose computer, special purpose computer, or other programmable data processing apparatus to produce a machine, such that the instructions that execute via the processor of the computer or other programmable data processing apparatus obtain powerflow solutions that observe and enforce control limits for a given network model under various realizations of the load, generation, and other parameters. The generalization of the example charts shown above to any other minimization procedure should be evident to any person skilled in the art.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various systems and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular systems and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right" ", ""left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The concepts herein have been described with references to specific systems and methods. While particular values, relationships, materials and steps have been set forth for purposes of describing such concepts, it will be appreciated by persons skilled in the art that numerous variations and/or modifications may be made to the systems and methods as shown in the disclosure without departing from the spirit or scope of the basic concepts and operating principles as broadly described. It should be recognized that, in the light of the above teachings, those skilled in the art could modify those specifics without departing from the concepts taught herein. Having now fully set forth certain systems and methods, and modifications of the concepts underlying them, various other systems and methods, as well as potential variations and modifications of the systems and methods shown and described herein, will obviously occur to those skilled in the art upon becoming familiar with such underlying concept. It is intended to include all such modifications and alternatives insofar as they come within the scope of the appended claims or equivalents thereof. It should be understood, therefore, that the concepts disclosed might be practiced otherwise than as specifically set forth herein. Consequently, the present systems and methods are to be considered in all respects as illustrative and not restrictive.

The invention claimed is:

1. A computer-implemented method to enforce control limits of an electrical power grid, the method comprising:
receiving data from a power management and distribution system representative of conditions of an electrical grid;
forming load flow equations from said data;
solving load flow equations for said electrical grid using a load flow equation solver in which automatic controls using a two-layered approach are enabled, wherein a first layer of said two-layered approach includes unlimited controlling resources using equality constraints for setpoints of the load flow equations and a second layer of said two-layered approach uses inequality constraints for the control resources;
expanding states of said load flow equations, each state comprising a choice of saturated controls and non-saturated controls, for a set of violating resource limits in said load flow equations;
constructing a Lagrangian function to determine voltages and currents for said load flow equations;
transcribing the Lagrangian function into software for use in a computer processor adapted to execute said software;
computing values of said Lagrangian function for said expanded states, using said computer processor;
using the values of the Lagrangian function in the load flow equations to identify control limits for the electrical grid;
establishing said control limits for steady state operation of said electrical grid; and
operating said electrical grid using said established control limits.

2. The method of claim 1, wherein, for those controls that are not saturated, the state has no violations of their control setpoint or band.

3. The method of claim 1, wherein, for those controls that are saturated, a local sensitivity of the control indicates that the corresponding setpoint/band can be achieved by un-saturating the control.

4. The method of claim 1, further comprising:
solving a constrained powerflow problem, in which particular saturated controls of a selected state are locked on their limits.

5. The method of claim 4, wherein solving the constrained powerflow problem further comprises:
embedding a mathematical model of the load flow equations for the electrical grid in a holomorphic embedding of said load flow equations using a variable in a complex domain that includes a first value corresponding to a no load case, in which there are no non-linear injections at any bus of said electrical grid and a second value corresponding to an objective case representative of said electrical grid in a problem case, each variable of said load flow equations being contained in said holomorphic embedding; and
solving the load flow equations, in which the particular saturated controls of the selected state are locked on their limits, using the holomorphic embedding.

6. A computer implemented method, comprising:
receiving data from a power management and distribution system representative of conditions of an electrical power generating system;
generating a mathematical model of load flow equations for an electrical grid in said power generating system having automatic controls for one or more control limits;
embedding said mathematical model in a holomorphic embedding of said load flow equations using a variable in a complex domain that includes a first value corresponding to a no-load case, in which there are no non-linear injections at any bus of said electrical grid and a second value corresponding to an objective case representative of said electrical grid in a problem case, each variable of said load flow equations being contained in said holomorphic embedding;
transcribing said holomorphic embedding into software for use in a computer processor adapted to execute said software;
developing in power series, values of unknowns in parameters of said holomorphic embedding, using said computer processor, said values of said unknowns in said parameters being in a neighborhood of said first value for said no load case of each parameter of said load flow equations;
solving said load flow equations for said electrical grid using a two-layered approach, wherein a first layer of said two-layered approach includes unlimited controlling resources using equality constraints for setpoints of the load flow equations and a second layer of said two-layered approach uses inequality constraints for the control resources;

expanding states of said load flow equations, using said computer processor, each state comprising a choice of saturated control limits and non-saturated control limits;

constructing a Lagrangian function, using said computer processor, to determine voltages and currents for said load flow equations;

said computer processor computing values of said Lagrangian function in said holomorphic embedding using said expanded states of said load flow equations;

using the values of the Lagrangian function in the load flow equations to identify control limits for the electrical grid;

establishing said control limits for steady state operation of said electrical grid; and operating said electrical grid using said established control limits.

7. The method of claim 6, wherein, for those controls that are not saturated, the state has no violations of their control setpoint or band.

8. The method of claim 6, wherein, for those controls that are saturated, a local sensitivity of the control indicates that the corresponding setpoint/band can be achieved by un-saturating the control.

9. The method of claim 6, further comprising:

solving the load flow equations, in which the particular saturated controls of the selected state are locked on their limits, using the holomorphic embedding.

10. The method of claim 6, further comprising:

receiving data from connectivity points of the electrical grid;

calculating, using said computer processor, a solution to the load flow equations using the data from the connectivity points of the electrical grid; and displaying the solution to the load flow equations within the control limits of the electrical grid.

11. The method of claim 10, wherein said step of receiving data from the connectivity points of the electrical grid comprises receiving data from a supervisory and data acquisition system representative of conditions of the electrical grid, and forming said load flow equations from said data.

12. The method of claim 11, wherein said data includes loads, generations, voltages, flows, and states of circuit breakers.

* * * * *